United States Patent
Koai et al.

[11] Patent Number: 6,159,299
[45] Date of Patent: Dec. 12, 2000

[54] WAFER PEDESTAL WITH A PURGE RING

[75] Inventors: Keith K. Koai, Los Gatos; Lawrence Chung-Lai Lei, Milpitas; Russell C. Ellwanger, San Juan Bautista, all of Calif.

[73] Assignee: Applied Materials, Inc., Santa Clara, Calif.

[21] Appl. No.: 09/247,673

[22] Filed: Feb. 9, 1999

[51] Int. Cl.[7] .............................. C23C 16/00; H04H 1/00
[52] U.S. Cl. ........................... 118/715; 118/728; 156/345
[58] Field of Search ................................ 118/728, 715, 118/725; 156/345

[56] References Cited

U.S. PATENT DOCUMENTS

| | | | |
|---|---|---|---|
| 4,645,218 | 2/1987 | Ooshio et al. | 279/269 |
| 5,213,650 | 5/1993 | Wang et al. | 156/345 |
| 5,246,881 | 9/1993 | Sandhu et al. | 438/681 |
| 5,262,029 | 11/1993 | Erskine et al. | 204/298.15 |
| 5,356,476 | 10/1994 | Foster et al. | 118/725 |
| 5,370,709 | 12/1994 | Kobayashi | 29/25.01 |
| 5,370,739 | 12/1994 | Foster et al. | 118/725 |
| 5,447,570 | 9/1995 | Schmitz et al. | 118/728 |
| 5,486,975 | 1/1996 | Shamouilian et al. | 361/234 |
| 5,494,523 | 2/1996 | Steger et al. | 118/723 E |
| 5,516,367 | 5/1996 | Lei et al. | 118/725 |
| 5,556,476 | 9/1996 | Lei et al. | 118/728 |
| 5,589,224 | 12/1996 | Tepman et al. | 427/248.1 |
| 5,688,331 | 11/1997 | Aruga et al. | 118/725 |
| 5,740,009 | 4/1998 | Pu et al. | 361/234 |
| 5,748,434 | 5/1998 | Rossman et al. | 361/234 |
| 5,766,365 | 6/1998 | Umotoy et al. | 118/728 |
| 5,803,977 | 9/1998 | Tepman et al. | 118/728 |
| 5,805,408 | 9/1998 | Maraschin et al. | 361/234 |
| 5,851,299 | 12/1998 | Cheng et al. | 118/729 |
| 5,888,304 | 3/1999 | Umotoy et al. | 118/720 |
| 5,997,651 | 12/1999 | Matsuse et al. | 118/725 |

FOREIGN PATENT DOCUMENTS

| | | |
|---|---|---|
| 0 467 623 A2 | 1/1992 | European Pat. Off. . |
| 0 553 691 A1 | 8/1993 | European Pat. Off. . |
| 0 595 307 A2 | 5/1994 | European Pat. Off. . |
| 0 595 307 A3 | 5/1994 | European Pat. Off. . |
| 0 601 788 A2 | 6/1994 | European Pat. Off. . |
| 0 606 751 A1 | 7/1994 | European Pat. Off. . |
| 0 742 579 A2 | 11/1996 | European Pat. Off. . |
| 0 742 579 A3 | 12/1996 | European Pat. Off. . |
| 0 790 641 A1 | 8/1997 | European Pat. Off. . |
| WO 97/23898 | 7/1997 | WIPO ............. H01L 21/00 |

*Primary Examiner*—Gregory Mills
*Assistant Examiner*—Parviz Hassanzadeh
*Attorney, Agent, or Firm*—Thomason, Moser & Patterson

[57] ABSTRACT

A wafer pedestal with a purge ring that circumscribes a peripheral edge of the wafer pedestal. The purge ring contains plurality of passages that are located proximate the peripheral edge of said wafer pedestal such that purge gas is directed towards the peripheral edge. Additionally, the purge ring cooperates with an edge ring assembly that circumscribes the purge ring. The purge ring and the edge ring assembly allow a dual-purge flow pattern to be established, which significantly reduces the accumulation of undesirable deposits upon the wafer pedestal.

23 Claims, 4 Drawing Sheets

WAFER PEDESTAL WITH A PURGE RING

CROSS REFERENCE TO RELATED APPLICATIONS

This application contains subject matter related to commonly assigned U.S. application Ser. No. 09/248,183, entitled "METHOD FOR PERFORMING METALLO-ORGANIC CHEMICAL VAPOR DEPOSITION OF TITANIUM NITRIDE AT REDUCED TEMPERATURE", filed simultaneously herewith, which is herein incorporated by reference.

BACKGROUND OF THE DISCLOSURE

1. Field of the Invention

The invention relates to a wafer pedestal for supporting a wafer in a semiconductor wafer processing system and, more particularly, to a wafer pedestal with a purge ring that directs purge gas to the periphery of the pedestal.

2. Description of the Background Art

Titanium nitride (TiN) film is widely used as a barrier or contact layer in integrated circuit fabrication, particularly for device applications. A TiN film may be formed by metal organic chemical vapor deposition (MOCVD) using precursors such as tetrakis (dialkylamino)-titanium, or $Ti(NR_2)4$, where R is an alkyl group. For example, U.S. Pat. No. 5,246,881, issued on Sep. 21, 1993, discloses thermal decomposition of tetrakis (dimethylamino)-titanium, or TDMAT, in combination with an activated species, for TiN deposition at temperatures of 200–600° C. and pressures of about 0.1 to 100 torr. Another U.S. Pat. No. 5,576,071 ('071 patent), issued on Nov. 19, 1996, discloses a similar TiN deposition process in the presence of a reactive carrier gas such as nitrogen at a pressure of 0.1–10 torr and a temperature in the range of 200–700° C.

While the choice of deposition parameters is primarily dictated by the desired characteristics in the deposited film, it is also constrained by the need for compatibility with other materials already present on the wafer substrate. For example, for 0.25 $\mu$m device applications, the capacitance of metal interconnects can contribute significantly to signal delays. To satisfy both speed and cross-talk requirements between metal interconnects, it is preferable that insulators be made of materials having a low dielectric constant (i.e., low K dielectric materials having K less than 3.8). However, current low K dielectric materials, which include a wide variety of fluorinated organic or inorganic compounds, are stable only up to about 400° C. Thus, backend processes including TiN deposition should preferably be performed at relatively low temperatures to ensure compatibility with these low K dielectrics and avoid adverse effects in device characteristics.

Aside from judicious choice and control of process parameters, a viable production-worthy process also needs to control particulate contamination, minimize equipment downtime, and facilitate ease of maintenance, among others. For deposition processes such as titanium nitride film deposition, it is inevitable that some deposits will be formed over interior surfaces of the process chamber, or other components inside the chamber. These deposits may, during the course of wafer processing or transport, flake off and land onto the wafers. Such contamination will adversely affect both the yield and reliability of the fabricated semiconductor devices. When a wafer heater is biased during post deposition plasma annealing, a film deposit formed on the heater surface leads to micro-arcing from the film deposit to, for example, the chamber wall. Such arcing introduces contaminants into the chamber environment.

Therefore, a need exists in the art for a low temperature TiN film deposition apparatus which minimizes undesirable deposits with improved control of particulate contamination and ease of equipment maintenance.

SUMMARY OF THE INVENTION

The disadvantages associated with the prior art are overcome by the present invention of a wafer support pedestal having a purge ring that directs purge gas to the periphery of the pedestal. Specifically, the invention comprises a wafer support pedestal having a peripheral edge and a purge ring positioned around the peripheral edge of the wafer support pedestal. The purge ring has a plurality of openings disposed around its inside perimeter. As such, the plurality of openings are located in close proximity to the peripheral edge of the wafer support pedestal. By directing a purge gas through the openings, the purge ring reduces the deposit accumulation on the edge of the wafer support pedestal by providing a continuous flow of purge gas about the edge of the pedestal.

In applications that require thermal decomposition of process gases to promote thin film deposition, the pedestal typically contains a resistive heater element. As such, the combination of the pedestal, heater elements and purge ring is known as a purge heater.

A removable edge ring assembly is also provided around the outer perimeter of the purge ring to shield the pedestal and purge ring from the process gases. By contacting the purge ring only at its coolest portion (i.e., at the outer perimeter), the edge ring assembly can be maintained at a relatively low temperature to help minimize deposits upon the edge ring assembly.

During titanium nitride (TiN) film deposition, a dual-purge gas flow is established around the purge heater and the edge ring assembly. An "edge purge" gas, such as $N_2$, is directed through the openings in the purge ring towards a peripheral edge of the wafer support pedestal at a flow rate of about 1500 sccm to minimize undesirable deposits around the pedestal. A "bottom purge" is also established by flowing $N_2$, typically at a rate of about 1000 sccm, around the bottom of the edge ring assembly to minimize inadvertent deposit on the edge ring components. This dual-purge flow eliminates a micro-arcing problem which otherwise arises from deposits accumulating around the purge heater, and reduces particulate contamination on the process wafers.

The edge purge gas flow is effective in preventing undesirable deposits upon the purge heater, thus rendering the purge heater essentially maintenance-free. As such, the pedestal and purge ring require little maintenance and the edge ring can be easily replaced when deposit accumulation occurs. The removable edge ring assembly greatly facilitates periodic maintenance and leads to significant reduction in equipment downtime.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
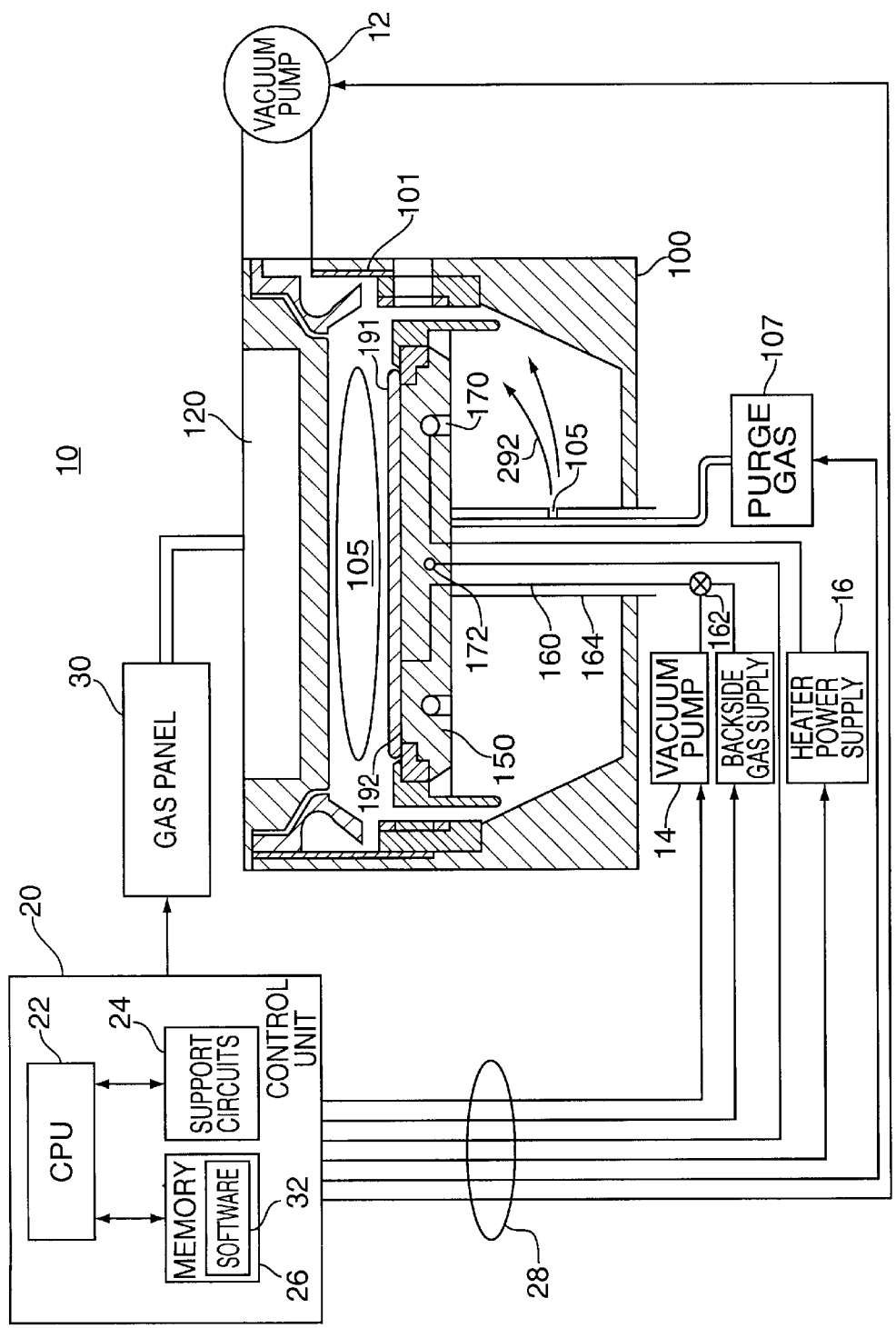
FIG. 1 shows a schematic illustration of a semiconductor wafer processing system incorporating the present invention.

FIG. 1 is a schematic representation of a semiconductor wafer processing system 10 incorporating the present invention. This system 10 typically comprises a process chamber 100, a gas panel 30, a control unit 20, along with other hardware components such as power supplies and vacuum pumps. Details of the system 10 used in the present invention are described in a commonly-assigned U.S. patent application, entitled "Reactor Useful for Chemical Vapor Deposition of Titanium Nitride," Ser. No. 09/023,852, filed Feb. 13, 1998, and is herein incorporated by reference. The salient features of this system 10 are briefly described below.

The process chamber 100 generally comprises a wafer support pedestal 150, which is used to support a substrate such as a semiconductor wafer 190. This pedestal 150 can typically be moved in a vertical direction inside the chamber 100 using a displacement mechanism (not shown). Depending on the specific process, the wafer 190 has to be heated to some desired temperature prior to processing. In the present invention, the wafer support pedestal 150 is heated by an embedded heater element 170. For example, the pedestal 150 may be resistively heated by applying an electric current from an AC supply 16 to the heater element 170. The wafer 190 is, in turn, heated by the pedestal 150. A temperature sensor 172, such as a thermocouple, is also embedded in the wafer support pedestal 150 to monitor the temperature of the pedestal 150 in a conventional manner. For example, the measured temperature may be used in a feedback loop to control the current output of the heater power supply 16 for the heating element 170 such that the wafer temperature can be maintained or controlled at a desired temperature which is suitable for the particular process application.

A vacuum pump 12, is used to evacuate the process chamber 100 and to maintain the proper gas flows and pressure inside the chamber 100. A showerhead 120, through which process gases are introduced into the chamber 100, is located above the wafer support pedestal 150. This showerhead 120 is connected to a gas panel 30 which controls and supplies various gases used in different steps of the process sequence.

In the present embodiment of the invention, TiN film deposition is accomplished by thermal decomposition of a metallo-organic compound such as tetrakis-dimethyl-amido titanium (TDMAT). Since TDMAT is a liquid at room temperature, it is introduced into the process chamber 100 by bubbling a carrier gas, such as helium, through a liquid sample contained in an ampoule or bubbler (not shown). Alternatively, a direct liquid injection system may also be used to introduce TDMAT vapor into the chamber 100.

To facilitate sample delivery using a bubbler, the bubbler is maintained at a temperature of about 50° C. to provide a TDMAT vapor pressure of greater than about 0.6 torr. Proper control and regulation of the gas flows through the gas panel 30 is performed by mass flow controllers (not shown) and a controller unit 20 such as a computer. The showerhead 120 allows process gases from the gas panel 30 to be uniformly distributed and introduced into the chamber 100. Illustratively, the control unit 20 comprises a central processing unit (CPU) 22, support circuitry 24, and memories 26 containing associated control software 32. This control unit 20 is responsible for automated control of the numerous steps required for wafer processing—such as wafer transport, gas flow control, temperature control, chamber evacuation, and so on. Bi-directional communications between the control unit 20 and the various components of the apparatus 10 are handled through numerous signal cables collectively referred to as signal buses 28, some of which are illustrated in FIG. 1.

A substrate, such as a wafer 190, which is positioned below and in close proximity to the showerhead 120, is retained on the pedestal 150 by vacuum chucking. The back surface, or backside 192, of the wafer 190 is connected to a vacuum line 160. This vacuum line 160 allows evacuation of the wafer backside 192 such that a pressure difference is established between the front surface 191 and the back surface 192 of the wafer 190. This net front pressure serves to hold the wafer 190 in position atop the pedestal 150. A three-way valve 162 is provided in the vacuum line 160 to connect the surface of the pedestal 150 to both a vacuum pump 14 and a gas supply 15. Depending on the specific application, this valve 162 can be controlled to optionally introduce a backside gas between the wafer backside 192 and the surface of the pedestal 150 as needed. The control unit 20 maintains the proper backside gas flow and pressure by controlling the valve 162, vacuum pump 14 and backside gas supply 15. Of course, other methods of retaining the wafer 190 may be used—e.g., electrostatic chuck, mechanical clamping, or simple gravity. In this particular embodiment, vacuum chucking and the use of a backside gas help improve the thermal conduction between the heated pedestal 150 and the wafer 190. As a result, the wafer 190 can be maintained at a relatively constant temperature by the heated pedestal 150 during the film deposition process.

The heated pedestal 150 used in the present invention is made of aluminum, and comprises a heating element 170 below the wafer support surface 151 of the pedestal 150. The heating element 170 is made of a nickel-chromium wire encapsulated in an Incoloy sheath tube. By properly adjusting the current output from the heater power supply 16 to the heating element 170, the wafer 190 and the pedestal 150 can be maintained at a relatively constant temperature during film deposition. This is accomplished by a feedback control loop, in which the temperature of the pedestal 150 is continuously monitored by a thermocouple 172 embedded in the pedestal 150. This information is sent to the control unit 20 via a signal bus 28, which responds by sending the necessary signals to the heater power supply 16. Adjustment is subsequently made in the current output of the heater power supply 16 so as to maintain and control the pedestal 150 at a desirable temperature—i.e., a temperature which is appropriate for the specific process application. When the process gas mixture exits the showerhead 120, thermal decomposition of TDMAT occurs in a reaction zone 105 at close proximity to the heated wafer 190, resulting in a deposition of TiN film over the wafer front surface 191.

Figure 2A:
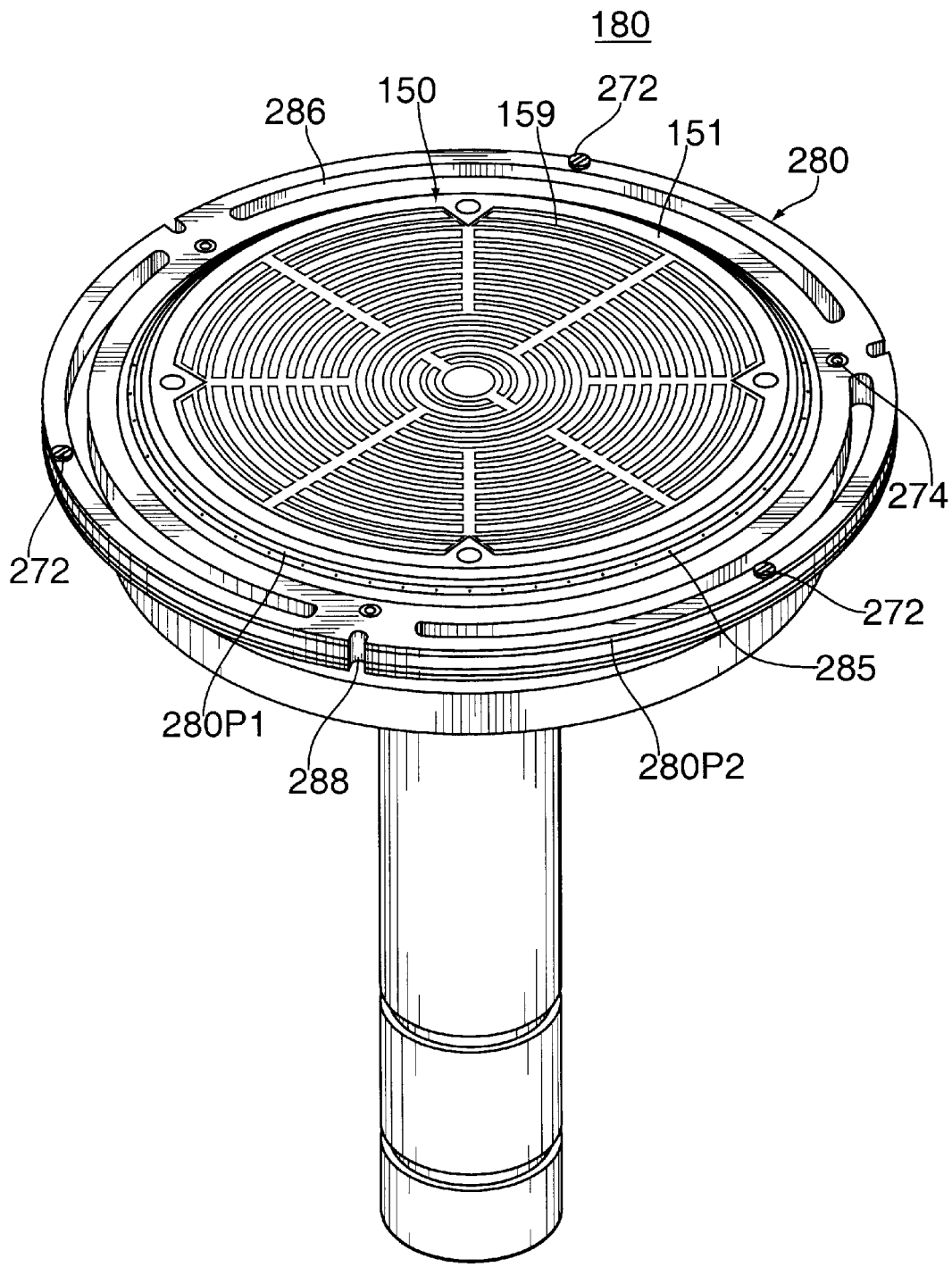
FIG. 2a shows a perspective view of a purge heater of the present invention.

FIG. 2a illustrates a perspective view of the pedestal 150 equipped with a purge ring 280. In one preferred embodiment, the purge ring 280 is welded to the pedestal 150, and the entire assembly, pedestal, heater element and purge ring is also referred to as a purge heater 180. Many grooves 159 are provided on the wafer support surface 151 of the pedestal 150 to facilitate vacuum chucking as well as backside gas distribution to the entire underside of a wafer.

The purge ring 280 is substantially annular in shape, and has three slots 286 disposed about half way between the inside perimeter 280P1 and the outside perimeter 280P2. Hundreds of small holes 285 are provided close to the inside perimeter 280P1 of the purge ring 280. These holes 285, also called purge holes, allow a flow of purge gas to be established around the pedestal 150. This "edge purge" prevents micro-arcing by minimizing undesirable deposits from forming on the peripheral edge of the pedestal 150 as well as the underside edge of the wafer.

Figure 2B:
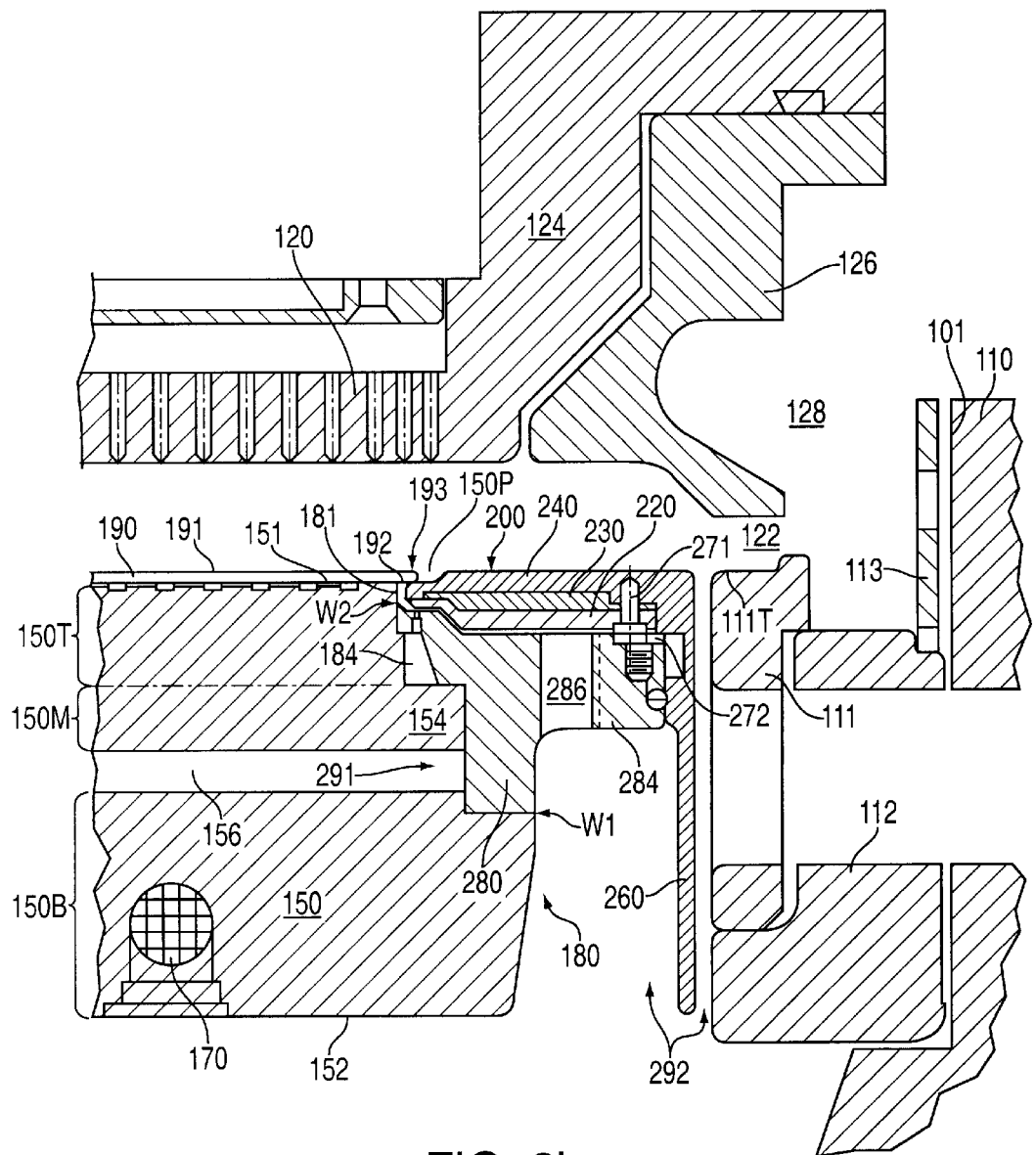
FIG. 2b shows a partial cross-sectional view of an edge ring assembly and the purge heater of FIG. 2a inside a process chamber.

FIG. 2b shows a partial cross-sectional view of a portion of the interior of the process chamber 100. The pedestal 150 is enclosed inside the chamber body 110 and is located below a showerhead 120, which supplies process gases and distributes them uniformly over the wafer 190. A lid isolator 126 is disposed around the outside 124 of the showerhead 120 to isolate the showerhead 120, which is RF driven during cleaning and post deposition annealing processes, from the chamber body 110 and lid plate (not shown), which are maintained at ground.

As shown in FIG. 2b, an edge ring assembly 200 rests upon the purge ring 280, which is disposed circumferentially around the pedestal 150. Various chamber components are disposed between the edge ring assembly 200 and the chamber body 110, including: 1) an inner shield 111 which is used to restrict the plasma from entering a pumping channel 128; 2) a chamber insert 112 that electrically isolates the inner shield 111 from the chamber body 110; and 3) an outer shield 113 that protects the inner wall 101 of the chamber body 110 from undesirable deposition.

Figure 2C:
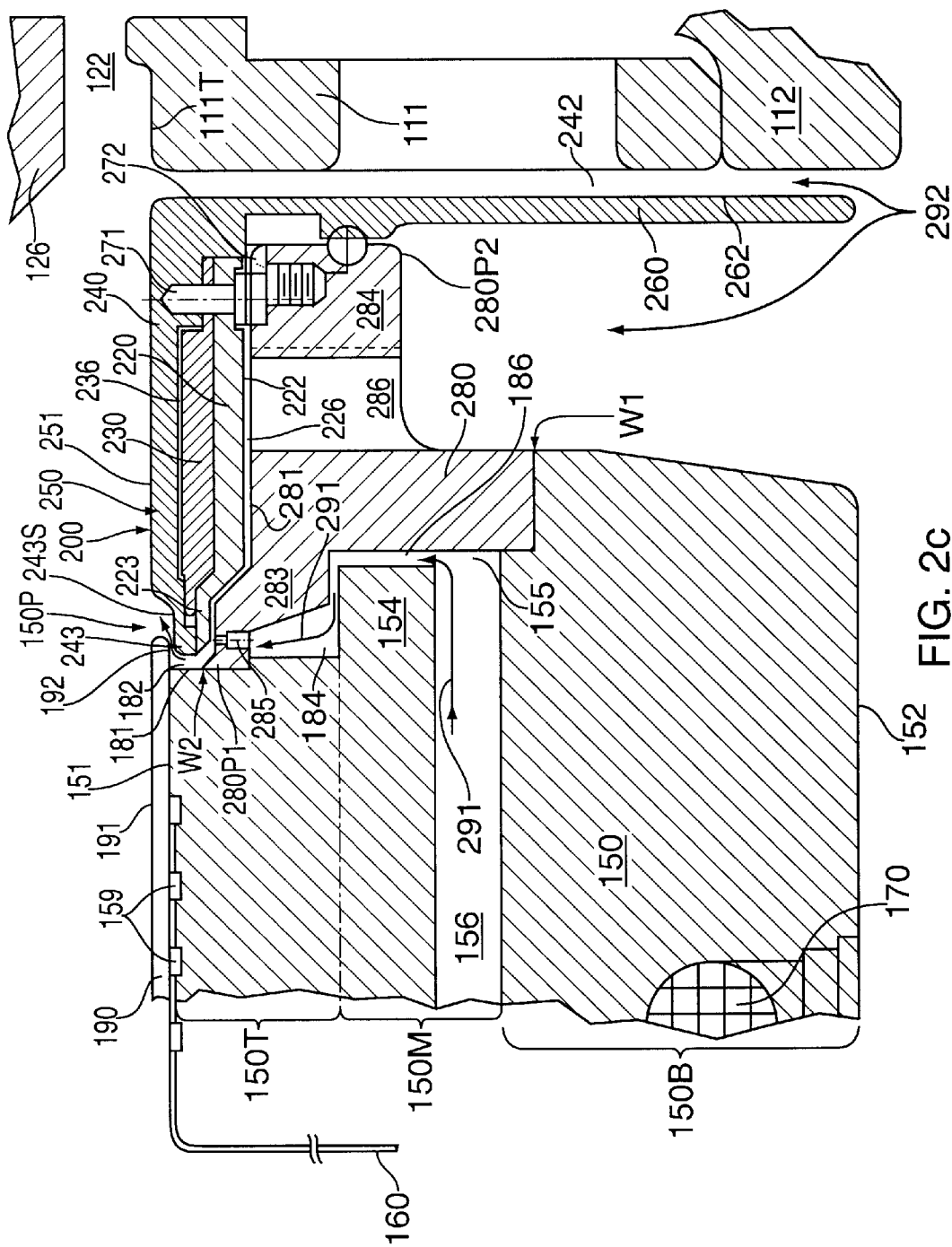
FIG. 2c shows an enlarged view of the edge ring assembly and the purge heater of FIG. 2b.

The pedestal 150 is substantially circular in shape, and has a heater element 170 embedded inside that maintains the pedestal 150 at a desired temperature. A wafer 190, which is placed upon the wafer support surface 151 of the pedestal 150, can then be maintained at a relatively constant temperature during wafer processing. The pedestal 150 has a step-like structure—the top portion 150T of the pedestal 150 has a smaller circumference than the middle portion 150M, which in turn has a smaller circumference than the bottom portion 150B. A total of eight horizontal channels 156 are provided inside the pedestal 150 for introducing a purge gas to flow along a circumferential vertical edge 181 near the top 150T of the pedestal 150. These channels 156 extend from the center of the pedestal 150 radially outwards to the openings 155, as shown in FIG. 2c. Other channels 159 are provided on the wafer support surface 151 of the pedestal 150 for vacuuming chucking of the wafer 190. These channels 159 are connected to a vacuum line 160 located inside the shaft 164 of the pedestal 150.

The purge ring 280, which is made of aluminum, is designed for directing a purge gas flow around the vertical edge 181 located at the top portion 150T of the pedestal 150. The purge ring 280 is welded, at locations W1 and W2, onto the heated pedestal 150 to form an integral unit, which is also referred to as a purge heater 180. Hundreds of equally spaced small holes 285 are provided on the inside portion 283 of the purge ring 280 so as to direct a purge gas flow along the vertical edge 181 of the pedestal 150. A channel 186 is formed between the middle portion 150M of the pedestal 150 and the purge ring 280. This channel 186 connects the opening 155 to a space 184 defined between the top portion 150T of the pedestal 150 and the purge ring 280.

A three-piece edge ring assembly 200, is located generally around the outer perimeter 150P of the pedestal 150. As shown in FIGS. 2b and 2c, the edge ring assembly 200 rests upon the purge ring 280, which fits around, and spaced from, the flange 154 of the pedestal 150. The edge ring assembly 200 comprises a top ring 240, a middle ring 230, and a lower ring 220. The top ring 240 is an annular aluminum piece with a substantially inverted L-shaped cross-section. The horizontal portion 250 of the top ring 240 rests on top of the upper surface 236 of a middle ring 230, while the vertical portion 260 of the top ring 240 extends downwards adjacent and in close proximity to the purge ring 280 and the pedestal 150. The middle ring 230 is a substantially flat annular piece which fits between the top ring 240 and the bottom ring 220. The bottom ring 220 is also substantially flat and annular in shape, with its inside portion 223 shaped to be complementary with the inside portion 283 of the purge ring 280. Both the middle ring 230 and the bottom ring 220 are made of a material having relatively poor thermal conductivity, such as 316 grade stainless steel. Consequently, the top ring 240 is maintained at a moderate temperature.

The top ring 240, middle ring 230 and bottom ring 220 are bolted together by three centering bolts 271. The edge ring assembly 200 is secured with respect to the purge ring 280 by engaging the centering bolts 271 with three slots 288 located at the outer perimeter 280P2 of the purge ring 280, and the edge ring assembly 200 rests upon three spacing pins 272 which are screwed into the outer portion 284 of the purge ring 280. (Note that the depictions in FIGS. 2b and 2c, which show a centering bolt 271 along with a spacing pin 272, are meant to illustrate only their relative radial positioning on the purge ring 280. The bolt 271 and pin 272 do not in fact contact each other.) As shown in FIG. 2a, the spacing pins 272 are disposed equidistantly from each other between the slot 286 and the outer perimeter 280P2 of the purge ring 280. With the edge ring assembly 200 resting upon the purge ring 280, a narrow channel 226 is formed between the top 281 of the purge ring 280 and the bottom 222 of the lower ring 220 to provide a flow path for a purge gas. In this particular configuration, the edge ring assembly 200 contacts the purge ring 280 only at the coolest areas of the purge ring 280—i.e., around the outer portion 284. Therefore, the temperature of the edge ring assembly 200 can be maintained at a relatively low temperature of about 310° C. for the purge ring 280 and undesirable deposits upon the edge ring components can be minimized. The spacing pins 272 can optionally be placed at other locations such as 274, disposed radially inwards from three small slots 288 at the outer perimeter 280P2 of the purge ring 280, as shown in FIG. 2a.

The edge ring assembly 200 is made of stainless steel and aluminum. Exposed surfaces, such as the top surface 251 and the outside edge 262 of the top ring 240, are roughened by bead-blasting to improve adhesion of any undesirable deposits that do form on these surfaces. Although the purge gas flow and edge ring temperature will minimize deposition ion the edge ring, some deposition will occur and this improved adhesion minimizes the chance of deposits flaking off from the edge ring assembly 200, and thus helps mitigate particulate contamination of the wafer 190.

During wafer processing, a purge gas, such as nitrogen or argon, is directed to flow along the top vertical edge 181 of the pedestal 150 towards the backside 192 of the wafer 190. Nitrogen ($N_2$) is selected as purge gas in this particular embodiment of the invention. Other gases, including inert gases, may also be used as long as they are process transparent. The purge gas is introduced (from purge gas supply 107 in FIG. 1) into channels 156 inside the pedestal 150, and exits via openings 155 located around the outer perimeter at the middle portion 150M of the pedestal 150. The gas follows a channel 186 and enters a space 184 formed between the pedestal 150 and the purge ring 280. From the space 184, the gas then flows through numerous small holes 285 in the purge ring 280 into another space 182 adjacent to a vertical edge 181 of the pedestal 150. This space 182 is defined generally by the inside portion 283 of the purge ring, the inside portion 203 of the edge ring assembly 200, the vertical edge 181 of the pedestal 150 and the backside 192 of a wafer 190 resting on top of the pedestal 150. This edge purge flow pattern, illustrated by the arrow 291, helps prevent undesirable film deposition on the vertical edge 181 of the pedestal 150, on the backside 192 of the wafer 190 and on the inside portion 243 of the top ring 240.

A bottom purge flow, indicated by the arrow 292, is formed by a second purge gas flowing around the elongated, vertical portion 260 of the top ring 240. This bottom purge gas flow is introduced by a line 105 in FIG. 1 through the bottom of the chamber 100, and helps minimize undesirable deposition on the edge ring assembly 200. One part of the bottom purge gas flow is directed into the channel 226 formed between the bottom ring 220 and the purge ring 280, where it merges with the edge purge flow in space 182. A second part of the bottom purge gas flows around the outside 262 of the elongated portion 260 of the top ring 240 into a space 242 defined between the elongated portion 260 and the inner shield 111. The purge gas is then pumped out, along with process gases, reaction by-products and edge purge gases via the space 112 between the lid isolator and the top 111T of the inner shield 111.

$N_2$ is used for both edge and bottom purge flows in the present invention, but argon or other gases, including inert gases, may also be used, as long as it does not interfere with the actual deposition process. In the preferred embodiment, a $N_2$ flow rate of about 1500 sccm is used for the edge purge, while that of the bottom purge is about 1000 sccm. In general, a flow range of about 500–3000 sccm is acceptable for both the edge and the bottom purge. Such relatively high flow rates are necessary to effectively prevent deposition in the proximity of the pedestal 150 and the edge ring assembly 200. Another advantage of this high purge flow is that it reduces the temperature of the edge ring assembly 200 to approximately (310°±10° C.). This reduced temperature serves to further minimize undesirable film deposition on the edge ring assembly 200. With this dual-purge (edge and bottom) capability, the process of the present embodiment results in a dramatic improvement in chamber performance, both by extending the time between cleans as well as preventing micro-arcing and particulate contamination.

To facilitate routine maintenance, this edge ring assembly 200 is designed to be separately removable from the purge heater 180. Even with the implementation of a bottom purge at high flow rate, it is inevitable that deposits will accumulate over surfaces such as 243S of the edge ring assembly 200 after long periods of processing. With the present invention, the edge ring assembly 200 can readily be removed for cleaning without the need to remove the purge heater 180. As such, equipment downtime during routine maintenance can be significantly reduced. For example, a replacement edge ring assembly 200 may be installed and the chamber 100 can be made available for processing within a few hours. This would not be economically feasible if the edge ring assembly 200 was an integral part of the purge heater 150.

The present invention of a purge heater with removable edge rings is used in a MOCVD process for TiN film deposition using thermal decomposition of TDMAT at a temperature below 350° C. One specific process that is facilitated by the present invention is described in U.S. patent application Ser. No. 09/248,183 filed simultaneously herewith. The purge heater comprises numerous purge holes for directing a purge gas flow along a peripheral edge of the heater such that undesirable deposits on the heater can be minimized. By incorporating the present invention in the process chamber, a micro-arcing problem is mitigated by preventing deposit accumulation around the heater. An edge ring assembly, which is disposed around the purge heater, is maintained at a temperature of about 310° C. This relatively low temperature, along with a bottom purge flow, minimizes undesirable deposits on the surfaces of the edge ring components. As a readily replaceable component, the removable edge ring assembly also facilitates routine maintenance and significantly reduces equipment downtime.

Although one preferred embodiment which incorporates the teachings of the present invention has been shown and described in detail, those skilled in the art can readily devise many other varied embodiments that still incorporate these teachings.

What is claimed is:

1. An apparatus for supporting a wafer within a process chamber comprising:
    a wafer pedestal having a peripheral edge;
    a purge ring, disposed around an outer perimeter of said wafer pedestal, having a plurality of openings disposed around an inside perimeter of said purge ring, where said plurality of openings are located in close proximity to said peripheral edge of said wafer pedestal for directing a purge gas flow along said peripheral edge of said wafer pedestal.

2. The apparatus of claim 1 further comprising: an edge ring assembly resting upon said purge ring.

3. The apparatus of claim 2 wherein said edge ring assembly contacts said purge ring on an outer edge thereof.

4. The apparatus of claim 2 wherein a portion of said wafer pedestal, said purge ring and said edge ring assembly together define at least one channel for directing a purge gas to flow along said peripheral edge of said wafer pedestal.

5. The apparatus of claim 1 wherein said wafer pedestal further comprises an embedded heating element.

6. The apparatus of claim 2, wherein said edge ring assembly is maintained at a temperature that is lower than a temperature of said wafer pedestal.

7. The apparatus of claim 2, wherein said edge ring assembly comprises:
    a top ring having an inner portion, a horizontal surface and a downwardly disposed vertical portion;
    a substantially flat annular bottom ring having an inner portion;
    a substantially flat annular middle ring disposed between said top and bottom rings;
    a fastener passing through openings in said top, middle and bottom rings.

8. The apparatus of claim 7 wherein said edge ring assembly rests upon a plurality of pins disposed upon said purge ring to form a channel between said bottom ring and said purge ring; and said downwardly disposed vertical portion of said top ring substantially circumscribes said purge ring and said outer perimeter of said wafer pedestal.

9. The apparatus of claim 7 wherein said middle and bottom rings are fabricated from a material having low thermal conductivity.

10. The apparatus of claim 9 wherein said material is stainless steel.

11. The apparatus of claim 7 wherein said top ring has a rough surface.

12. An edge ring assembly for a semiconductor wafer processing system comprising:
 a top ring having an inner portion, a horizontal surface and a downwardly disposed vertical portion;
 a substantially flat annular bottom ring having an inner portion;
 a substantially flat annular middle ring disposed between said top and bottom rings;
 a fastener passing through openings in said top, middle and bottom rings.

13. The edge ring of claim 12 wherein said middle and bottom rings are fabricated from a material having low thermal conductivity.

14. The edge ring of claim 13 wherein said material is stainless steel.

15. The edge ring of claim 14 wherein said top ring has a rough surface.

16. Apparatus for deposition of titanium nitride upon a substrate by thermal decomposition of a metallo-organic compound comprising:
 a wafer pedestal having a peripheral edge, and an embedded heating element;
 a showerhead spaced apart from said wafer pedestal;
 a purge ring attached circumferentially to said wafer pedestal, said purge ring having passages located proximate a peripheral edge of said wafer pedestal;
 a purge gas supply coupled to said passages in said purge ring;
 an edge ring assembly disposed upon said purge ring to form a channel between said edge ring assembly and said purge ring to allow passage of a purge gas towards said peripheral edge of said wafer pedestal.

17. The apparatus of claim 16 wherein said edge ring assembly contacts said purge ring on an outer edge thereof.

18. The apparatus of claim 16 wherein said edge ring assembly is maintained at a temperature that is lower than a temperature of said wafer pedestal.

19. The apparatus of claim 16 wherein said edge ring assembly comprises:
 a top ring having an inner portion, a horizontal surface and a downwardly disposed vertical portion;
 a substantially flat annular bottom ring having an inner portion;
 a substantially flat annular middle ring disposed between said top and bottom rings;
 a fastener passing through openings in said top, middle and bottom rings.

20. The apparatus of claim 19 wherein said edge ring assembly rests upon a plurality of pins disposed upon said purge ring to form a channel between said bottom ring and said purge ring; and said downwardly disposed vertical portion of said top ring substantially circumscribes said purge ring and said outer perimeter of said wafer pedestal.

21. The apparatus of claim 20 wherein said middle and bottom rings are fabricated from a material having low thermal conductivity.

22. The apparatus of claim 21 wherein said material is stainless steel.

23. The apparatus of claim 19 wherein said top ring has a rough surface.

* * * * *